United States Patent
Kanatake et al.

[19]

[11] Patent Number: 6,136,617

[45] Date of Patent: Oct. 24, 2000

[54] ALIGNMENT SYSTEM FOR A SPHERICAL SHAPED DEVICE

[75] Inventors: Takashi Kanatake, Dallas, Tex.; Hiroshi Koshizuka, Matida, Japan

[73] Assignee: Ball Semiconductor, Inc., Allen, Tex.

[21] Appl. No.: 09/350,634

[22] Filed: Jul. 9, 1999

Related U.S. Application Data

[60] Provisional application No. 60/092,262, Jul. 10, 1998.

[51] Int. Cl.$^7$ .............................. H01L 21/66; H01L 29/06
[52] U.S. Cl. .............................................. 438/14; 257/618
[58] Field of Search ........................... 438/14, 689, 690; 118/60, 62; 117/901; 204/192.1, 192.33; 264/13, 14; 257/618

[56] References Cited

U.S. PATENT DOCUMENTS 5,955,776  9/1999  Ishikawa ................................. 257/618

OTHER PUBLICATIONS

Application No. 08/858,000, filed May 16, 1997, entitled: Spherical Shaped Semiconductor Integrated Circuit by Akira Ishikawa, copy of first page of specification, abstract and figure No. one (Attorney Docket No. 22397.3.02).

Application No. 09/066,222, filed Apr. 24, 1998, entitled: Touchless Stabilizer for Processing Spherical Shaped Devices by Ramesh Kasim and Ram Ramamurthi, copy of first page of specification, abastract and figure No. one (Attorney Docket No. 22397.65).

*Primary Examiner*—Charles Bowers
*Assistant Examiner*—Hsien-Ming Lee
*Attorney, Agent, or Firm*—Haynes and Boone, LLP

[57] ABSTRACT

A processing apparatus and method for positioning a device, in particular a spherical-shaped semiconductor device, is disclosed. The device to be processed is contained in a carrier fluid which is used to control the movement of the device. A physical deformity, previously induced onto the device, causes the device to align itself in a calculable manner within the fluid so as to reduce drag. The location and particular shape of the deformity define the specific alignment the device will achieve. Once roughly aligned, a plurality of energy sources project device shadows upon sensors that are sensitive to the energy source being used. The information acquired by the sensors is then used to calculate the position of the device.

15 Claims, 2 Drawing Sheets

ALIGNMENT SYSTEM FOR A SPHERICAL SHAPED DEVICE

CROSS REFERENCE

This invention relies on a provisional patent application U.S. Ser. No. 60/092,262 filed on Jul. 10, 1998.

BACKGROUND OF THE INVENTION

The invention relates generally to semiconductor integrated circuits, and more particularly, to an apparatus and method for positioning a spherical-shaped semiconductor integrated circuit.

Conventional integrated circuits, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

A fabrication facility is relatively expensive due to the enormous effort and expense required for creating flat silicon wafers and chips. For example, dust-free clean rooms and temperature-controlled manufacturing and storage areas are necessary to prevent the wafers and chips from defecting. Also, these types of fabrication facilities suffer from a relatively inefficient throughput as well as an inefficient use of the silicon. For example, facilities using in-batch manufacturing, where the wafers are processed by lots, must maintain huge inventories to efficiently utilize all the equipment of the facility. Also, because the wafers are round, and the completed chips are rectangular, accommodations must be made for the different shaped components.

A benefit of wafers is that they can be manipulated and aligned relatively easily. Wafers typically undergo a process in which a "flat" is created on one portion of its outer edge. Furthermore, processing only occurs on one side, or "face" of the wafer. The back side of the wafer, along with the wafer flat, produces an area where the wafer can be touched or handled without physical contact with other parts of the wafer and can be easily aligned. For example, the wafer can be placed on a vacuum chuck for processing. This is important because, while physical contact is required to manipulate the wafer during the many processing steps, undue contact may damage or render the wafer unusable.

Due to these and various other problems, only a few companies in the world today can successfully manufacture conventional flat chips. Furthermore, the chips must bear a high price to cover the costs of manufacturing, as well as the return on initial capital and investment.

In U.S. Pat. No. 5,955,176 filed on May 16, 1997, a method and apparatus for manufacturing spherical-shaped semiconductor integrated circuit devices is disclosed. The patent application describes several different non-contact processing techniques and requirements for manufacturing a spherical shaped device. Current methods, such as those associated with conventional wafer processing, are inadequate when called upon to handle shapes other than those resembling conventional flat wafers and chips, particularly when those shapes have curved or spherical surfaces.

For example, one difficulty associated with a spherical device is that it is difficult to align for specific processing operations. This is due primarily to how the spherical devices are processed while falling or floating through a processing tube or being held by a touchless nozzle. Also, although cameras can be used to locate alignment marks on a spherical shaped device, the alignment marks must first be in the rough vicinity of the cameras (as opposed to an opposite side of the device). Furthermore, since the device is often processed without being contacted, as opposed to the wafer on the chuck, the device's location in space is also unknown, despite the use of the alignment marks.

Therefore, what is needed is an apparatus and method for positioning and aligning such a spherical shaped device for processing operations.

Furthermore, what is needed is an apparatus and method that does not require physical contact with the spherical shaped device for positioning and aligning.

SUMMARY OF THE INVENTION

The present invention, accordingly, provides an apparatus and method for positioning a device, in particular a spherical-shaped semiconductor, for processing. To this end, one embodiment provides an apparatus and method for aligning a semiconductor integrated circuit, such as a spherical-shaped semiconductor device, for processing operations such as photolithography. The device to be processed is contained in a carrier fluid which is used to control the movement of the device. A physical deformity, previously induced onto the device, causes the device to align itself in a calculable manner within the fluid so as to reduce drag. The location and particular shape of the deformity define the specific alignment the device will achieve.

In another embodiment, the present invention provides an apparatus and method for finding the position of a semiconductor integrated circuit, such as a spherical-shaped semiconductor device suspended in a fluid, for processing operations. A plurality of energy sources project device shadows upon sensors that are sensitive to the energy sources being used. The information acquired by the sensors is then used to calculate the position of the device. Multiple energy sources and multiple sensors can be used to achieve increasingly accurate measurements.

One benefit of the present invention is that a spherical shaped device can be positioned and aligned for processing operations.

Another benefit of the present invention is that it does not require physical contact with the spherical shaped device for positioning and aligning.

DESCRIPTION OF THE PREFERRED EMBODIMENT

Figure 1:
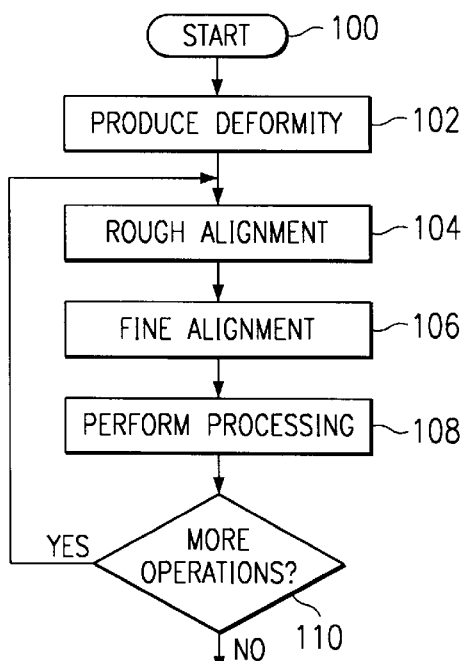
FIG. 1 is a flowchart for aligning a spherical shaped semiconductor device in a touchless processing environment.

Referring to FIG. 1, a method 100 describes the preparation, processing, and post processing steps which a device, such as a spherical shaped semiconductor, must generally undergo. For the sake of example, the device could be of the same type formed according to the technique disclosed in the above-identified patent application Ser. No. 08/858,004.

Execution begins at step 102, where a deformity is induced onto the device. It is understood, however, that the device may have already received one or more prior processing operations before step 102.

Figure 2A:
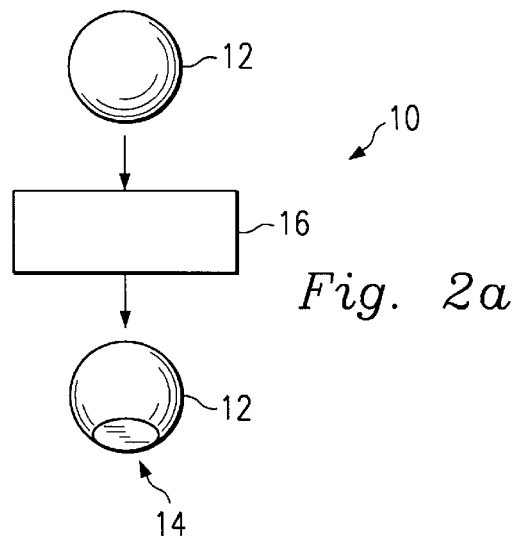
FIG. 2a illustrates one embodiment of a system for inducing a deformity onto the spherical shaped semiconductor device.

Referring also to FIG. 2a, the reference numeral 10 represents a system for creating a deformity 14 on a device, such as a spherical-shaped semiconductor integrated circuit device 12. The deformity 14 may be in the form of a depression, a protuberance, a slice, a non-symmetrical appendix, or other appropriate shape. The device 12 undergoes a procedure 16, which may use any of a variety of methods to induce the desired deformity 14. For example, an image of the deformity 14 may be projected onto the device and the desired deformity then formed by using conventional etching methods. Alternatively, the deformity 14 may be made by physically cutting the device so as to produce the predetermined shape. The deformity 14 is of predetermined shape and size and is positioned at a predetermined location on the device 12. In some embodiments, the location of the deformity 14 may be arbitrary, particularly on a perfectly spherical device. In these embodiments, subsequent processing operations can then align to the deformity 14, and thus to the previous operations. For the purposes of this example, the deformity 14 on the device 12 is a relatively small etched indentation in the surface of the device.

Referring again to FIG. 1, the device 12 undergoes a rough alignment procedure in step 104 that utilizes the deformity 14 to approximately position the device on one axis. It is understood, however, that one or more intervening processing operations may have occurred between steps 102 and 104.

Figure 2B:
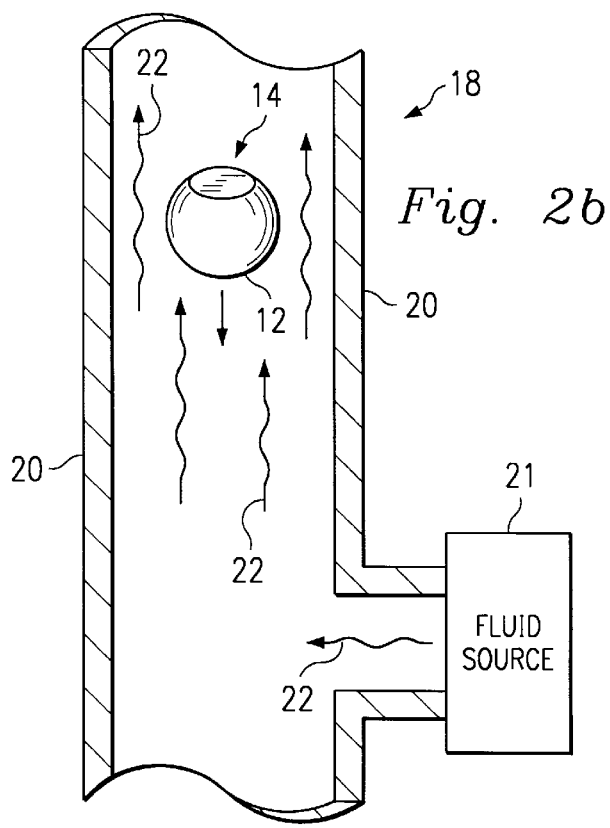
FIG. 2b illustrates one embodiment of a system for self-aligning the spherical shaped integrated circuit device.

Referring also to FIG. 2b for a more detailed illustration, the reference numeral 18 designates, in general, a system for self-aligning a device such as device 12. The device 12 moves through a processing tube 20 which contains a carrier fluid 22, which for the sake of example will be a processing gas, such as is commonly used for conventional semiconductor processing. The carrier fluid 22 may be regulated and controlled by any known means, including alterations in its flow rate, pressure, density or temperature, either before or after it issues from fluid source 21. In some embodiments, the device 12 moves downward (with gravity), while in other embodiments, the carrier gas suspends or lifts the device as needed. The device 12 may also be rotated as desired by the carrier gas 22, allowing control over the positioning of the device without the need for physical contact. Formed on the device 12 is the deformity 14, which is induced onto the device as described above.

As the device 12 moves against the carrier gas 22 inside the tube 20, the device will rotate to reduce drag in a calculable manner. This rotation will be consistent from device to device as long as the deformity 14 is relatively consistent. At the point of least resistance, the rotation will stop and the device 12 will be approximately aligned on one axis. In keeping with the current example where the deformity 14 is an indentation, the device 12 will rotate within the carrier gas 22 flow so that the indentation faces away from the flow. This presents the least resistance to the carrier gas 22 possible, and the device 12 will remain so aligned as long as the fluid flow remains uniform, as specifically illustrated in FIG. 2b.

Once aligned, the device 12 can be received by a nozzle (not shown) such as is described in patent application Ser. No. 09/066,222, which is herein incorporated by reference. The nozzle (or various other methods) can then be used for fine alignment. After the fine alignment occurs in step 106 of FIG. 1, the device 12 undergoes a processing operation 108. If more operations are necessary as determined in step 110, device 12 then passes through the alignment procedures as required to again achieve proper orientation.

Figure 3:
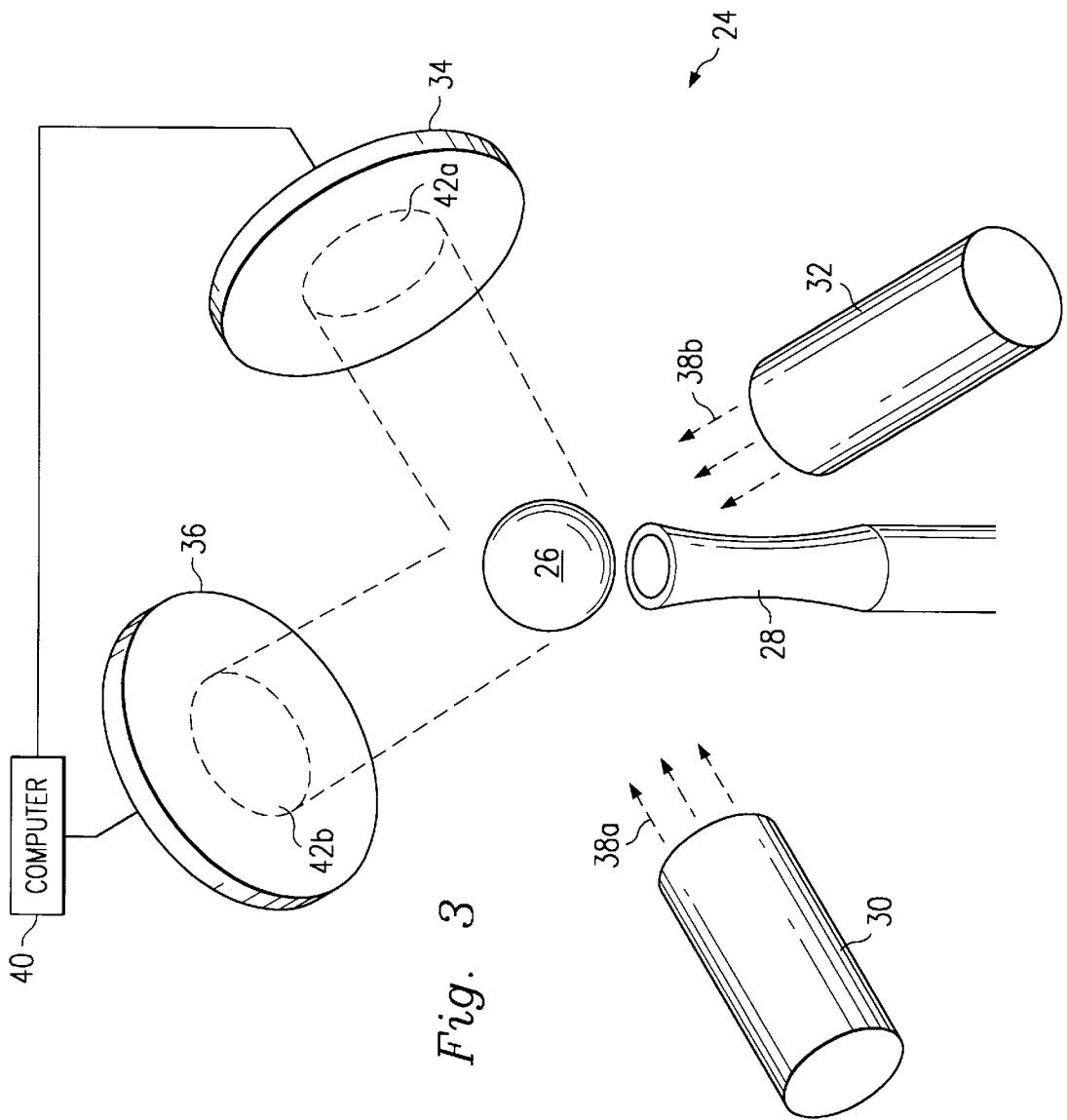
FIG. 3 illustrates one embodiment of a system for measuring the position of a spherical shaped integrated circuit device.

Referring to FIG. 3, the reference numeral 24 designates, in general, a system for measuring the position of a device, such as a spherical-shaped semiconductor integrated circuit device 26. The device 26 may be similar to the device 12 of FIG. 2, except no deformity 14 is needed.

The device 26 is received and held by a device such as a nozzle 28. Two energy sources 30, 32 and two sensors 34, 36 which are sensitive to energy from the sources are positioned around the device 26. For the sake of clarity, the energy sources in this embodiment of the invention are lasers but could be any type of energy source capable of producing and projecting measurable energy. The lasers 30, 32 are conventional lasers capable of producing a beam diameter about the same size as the device 26 (e.g., one millimeter for the purposes of this example). The sensors 34, 36 are also conventional, such as Quantum Sensors. The sensors 34, 36 are further connected to a computing center 40.

In operation, a laser beam 38a from the laser 30 projects onto the device 26 and a shadow 42a is created on the optical sensor 34. Also, a laser beam 38b from laser 32 projects onto the device 26 from a different angle than that of laser 30 and a shadow 42b is projected onto the optical sensor 36. The computer 40 determines a difference between the two shadows 42a, 42b detected by each sensor 34, 36. This difference identifies a location error of the device 26 from a central point of the lasers 30, 32 and sensors 34, 36. If the diameter of the beams 38a, 38b is approximately equal to that of the device 26, then a high degree of accuracy can be achieved. The position of a device suspended in a fluid can therefore be determined to the necessary exactness with respect to three axes, enabling proper application of processing operations such as photolithography.

It is understood that several variations may be made in the foregoing. For example, different shaped devices can be processed in the above-described systems. Additional modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A system for aligning a three dimensional device for processing, the device having at least one physical deformity on its surface, the system including:
   a carrier fluid to control movement of the device;
   a mechanism to control fluid flow rate, pressure, density and temperature;
   a tube to contain the fluid and device during at least part of the alignment process, so that a drag from the fluid flow aligns the device in a calculable manner; and
   means for forming the at least one physical deformity on the device's surface in a calculable manner.

2. The system of claim 1 wherein the means for forming the at least one physical deformity uses a semiconductor etch process.

3. The system of claim 1 wherein the device is a spherical shaped semiconductor.

4. The system of claim 1 wherein the fluid is a processing gas.

5. The system of claim 1 wherein the device has a plurality of deformities on its surface.

6. A method for aligning a device for semiconductor processing, comprising:

suspending the device in a carrier fluid;

controlling movement of the device with the carrier fluid by varying at least one of a flow rate, pressure, density, or temperature of the fluid so that a drag from the fluid across a physical deformity on the device aligns the device in a calculable manner.

7. The method of claim 6 further comprising:

forming the physical deformity on an outer surface of the device.

8. The method of claim 6 wherein the device is a spherical shaped semiconductor substrate.

9. The method of claim 6 wherein the fluid is a non-processing gas.

10. A system for determining the location of a device suspended in a fluid for processing, the system comprising:

first and second energy sources;

first and second sensors sensitive to energy from the first and second energy sources, respectively, so that energy from the first and second energy sources projects first and second device shadows onto the first and second sensors, respectively, and the sensors provide measurements from the shadows; and computing means coupled to the sensors for receiving the measurements and determining a location of the device from the measurements.

11. The system of claim 10 wherein the energy source is a laser.

12. The system of claim 10 wherein the device is a spherical shaped semiconductor.

13. The method of claim 12 wherein the device is a spherical shaped semiconductor with a diameter and wherein energy from the first and second energy sources has a size approximately equal to the diameter.

14. A method for measuring the location of a device suspended in a fluid, the method comprising:

projecting a first device shadow onto a first energy sensitive sensor by means of a first energy source;

projecting a second device shadow onto a second energy sensitive sensor by means of a second energy source;

generating information from the first and second shadows; and calculating the device location using the generated information.

15. A system for aligning a three dimensional device for processing, the device having at least one physical deformity on its surface, the system including:

a carrier fluid to control movement of the device;

a mechanism to control fluid flow rate, pressure, density and temperature; and a tube to contain the fluid and device during at least part of the alignment process, so that a drag from the fluid flow aligns the device in a calculable manner.

* * * * *